(12) United States Patent  
Yang et al.

(10) Patent No.: US 7,776,728 B2
(45) Date of Patent: Aug. 17, 2010

(54) RAPID THERMAL PROCESS METHOD AND RAPID THERMAL PROCESS DEVICE

(75) Inventors: Chan-Ion Yang, Taipei (TW); Ching-I Li, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 575 days.

(21) Appl. No.: 11/681,745

(22) Filed: Mar. 2, 2007

(65) Prior Publication Data

US 2008/0210667 A1 Sep. 4, 2008

(51) Int. Cl.
*H01L 21/20* (2006.01)

(52) U.S. Cl. .............................. 438/584; 257/E21.411; 257/E29.273

(58) Field of Classification Search ................ 438/584; 257/E21.411, E29.273
See application file for complete search history.

(56) References Cited

U.S. PATENT DOCUMENTS 5,962,868 A * 10/1999 Tanida ......................... 257/48
6,274,388 B1 * 8/2001 Aggarwal et al. .............. 438/3
6,468,901 B1 * 10/2002 Maa et al. ................... 438/655

* cited by examiner

*Primary Examiner*—David S Blum
(74) *Attorney, Agent, or Firm*—Winston Hsu (57) ABSTRACT

A rapid thermal process method contains providing a substrate, performing a pre-heating process to at least a first portion of the substrate by means of a first laser beam, and performing a rapid heating process to the pre-heated first portion of the substrate by means of a second laser beam.

17 Claims, 7 Drawing Sheets

RAPID THERMAL PROCESS METHOD AND RAPID THERMAL PROCESS DEVICE

BACKGROUND OF THE INVENTION

1. Field of the Invention

The invention relates to a rapid thermal process method and a rapid thermal process device for practicing the rapid thermal process method, and more particularly, to a rapid thermal process method and a rapid thermal process device containing a pre-heating process by means of a laser beam.

2. Description of the Prior Art

With the advancing technology of the semiconductor industry, integrated circuits (ICs) are being developed to increase the current computing and storage capability, which pushes the development of related manufacturers forward. As predicted by Moore's law, the number of transistors doubles every 18 months. The process of semiconductor evolves from 0.18 μm of 1999, 0.13 μm of 2001, 90 nm of 2003 to 65 nm of 2005 and is approaching 45 nm. Therefore, the density of semiconductor elements on a wafer is increasing with the technology advancement of the semiconductor industry and miniaturization of microelectronic elements and makes the intervals between elements shorter and shorter. Under this situation, many semiconductor fabrication processes face new challenges and bottlenecks, and therefore the manufacturers have to keep on researching new fabrication technologies to meet the request of high integration.

Among various semiconductor fabrication processes, the rapid thermal process (RTP) is a very important technology and has been widely applied to the thermal activating of semiconductor processes in the fabrication of very large scale integration (VLSI) field. Its application may contain the formation of the ultra shallow junction (USJ) of metal-oxide-semiconductor (MOS) transistors, ultra thin oxide layer growth, annealing, diffusion, formation of metal silicide, and even the semiconductor layer of thin film transistors. With the advancing technology of the semiconductor industry, rapid thermal processes are being developed to meet the requirements of high fabrication grades. According to the development of thermal processes, high-temperature furnace is a representative tool in earlier technology, and the spike rapid thermal annealing is utilized for rapid thermal treatment in the 90 nm grade process. Currently, as the semiconductor technology is developed to the 65 nm grad process, new rapid thermal processes, such as flash/non-melt annealing, impulse and laser annealing, are researched to be applied. Correspondingly, the process time of a thermal process becomes shorter and shorter. For example, the process time is about 10 sec for the earlier furnace process, and the process time is shortened to about 1 sec, even about 1 msec (millisecond) for the current thermal process.

The laser thermal process is applied to rapidly heating and cooling semiconductor materials, such as the application of laser annealing process, and has been widely applied to the fabrication of display devices, such as liquid crystal displays (LCD). In the liquid crystal display devices, since a normal glass substrate can only work at a temperature below 600° C., fabricating a polysilicon film directly under a high temperature will make the glass substrate twisted. Thus, in a conventional method of fabricating a polysilicon thin film transistor, an expensive quartz substrate is needed and only a small size liquid crystal display panel can be made. Recently, a method of forming a low temperature polysilicon (LTPS) thin film transistor (TFT) by crystallizing an amorphous silicon film is gradually developed for the mass production of large size liquid crystal displays. Among the methods of forming polysilicon film, the excimer laser annealing (ELA) process is the major focus, which means the excimer laser is used as a heat source to transfer the amorphous silicon structure into a polysilicon structure. When the excimer laser passes through an optical projection system, a laser beam with uniform energy is generated that projects to the substrate having the amorphous film thereon so that the amorphous film may absorb the energy and transfer into a polysilicon film. Since the above-mentioned process can be finished below 600° C., it can be applied to general glass substrates or plastic substrates. Therefore, the application field of LTPS TFT liquid crystal displays is broadened.

As a result, the laser thermal process has become a very important process technology whether in the fabrication process of the IC field or the display field. According to the prior-art laser thermal process, the substrate (such as a semiconductor wafer) needed a thermal treatment is set on a chuck in a chamber. The chuck with a heater is used to heat the whole substrate to a critical temperature of the substrate, such as 400° C. so that free carriers are generated. Then, the laser beam is used to scan the substrate for performing a rapid heating process to raise the temperature of the substrate to about 1200° C. or higher for completing the annealing or re-crystallization process. However, the design of the chuck is limited so that it is easy to occur temperature non-uniformity on the substrate. In addition, it takes about 3 to 10 minutes for the laser scan at a time, thus the whole substrate has to be heated at the high temperature of 400° C. for 3 to 10 minutes, which easily causes systematic sheet resistance due to temperature non-uniformity and high thermal budget. Even more, the substrate heated by the hot chuck may be broken resulting from the thermal stress. Furthermore, in order to improve the wafer temperature uniformity, tool supplier designs vacuum or electrostatic chucks. However, the vacuum or electrostatic design may still cause wafer breakage. Taking the vacuum chuck as an example, the adsorptive power is unbalanced at various position of the surface of the substrate while the vacuum function is provided, which influences the thermal stress of the surface of the substrate. Therefore, the contact of the laser beam with high temperature easily causes broken of the substrate. As a result, it is difficult to improve the heating performance by modifying the chuck because the modification of the hardware costs much time and money. In addition, the process time of the pre-heating or cooling down of the conventional chuck for a whole substrate is too long to improve the throughout.

Accordingly, how to improve the rapid thermal process with low thermal budget of semiconductor industry and provide a rapid thermal process device that avoids thermal stress is still an important issue of the semiconductor industry.

SUMMARY OF THE INVENTION

It is a primary objective of the claimed invention to provide a rapid thermal process method and a rapid thermal process device by using a laser beam to execute the pre-heating process for solving the above-mentioned problem of temperature non-uniformity and substrate breakage.

According to the claimed invention, the rapid thermal process method comprises providing a substrate, performing a locally pre-heating process by means of a first laser beam to at least a first portion of the substrate, and performing a rapid heating process to the pre-heated first portion of the substrate.

According to the claimed invention, the rapid thermal process device comprises at least a heating system and at least an automatic power control (APC) device. The heating system provides a first laser beam and a second laser beam. The first laser beam is used for performing a pre-heating process to a substrate, and the second laser beam is used for performing a rapid heating process to the substrate. The APC device is capable of real-time detecting the performances of the pre-heating process or the rapid heating process so as to real-time regulate the settings of process parameters of the first laser beam and the second laser beam.

It is an advantage of the claimed invention that the first laser beam is used for pre-heating the substrate so that the substrate can be locally heated to a predetermined temperature rapidly while the other portions of the substrate are still kept under a low temperature. Accordingly, the thermal budget of the rapid thermal process is lowered, and the risk of substrate breakage due to thermal stress can be avoided. The disadvantage of long process time of heating and cooling down of the conventional chuck is also improved. Furthermore, the rapid thermal process method and rapid thermal process device of the present invention provide a function of real-time regulating the settings of the laser beams so as to effectively control the process and kept it under a preferable situation without modifying any chuck or tool equipments.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 1 to FIG. 5, wherein FIG. 1 to FIG. 5 are schematic diagrams of the rapid thermal process method and rapid thermal process device according to a first embodiment of the present invention. The rapid thermal process method of this embodiment may be applied to a fabrication process of the ultra shallow junction (USJ) of an MOS transistor of semiconductor wafers. First, with reference to FIGS. 1-2, a substrate 10 in need of a rapid thermal process is provided, wherein the substrate 10 may comprise a semiconductor wafer 12, such as a silicon wafer, comprising at least a MOS transistor regions 14 thereon. A gate 16 and a gate oxide layer 18 are formed on the surface of the substrate 10, and an ion implantation process has been performed to the substrate 10 so as to form the source/drain extension doping regions 20.

Figure 1:
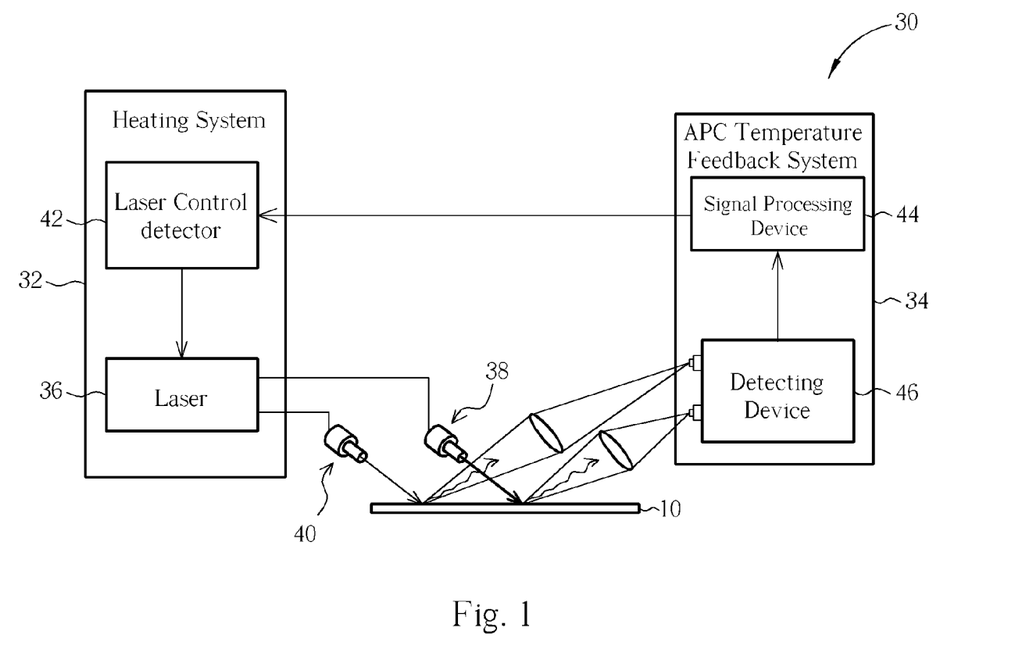
FIGS. 1-5 are schematic diagrams of the rapid thermal process method and rapid thermal process device according to a first embodiment of the present invention.
Figure 2:
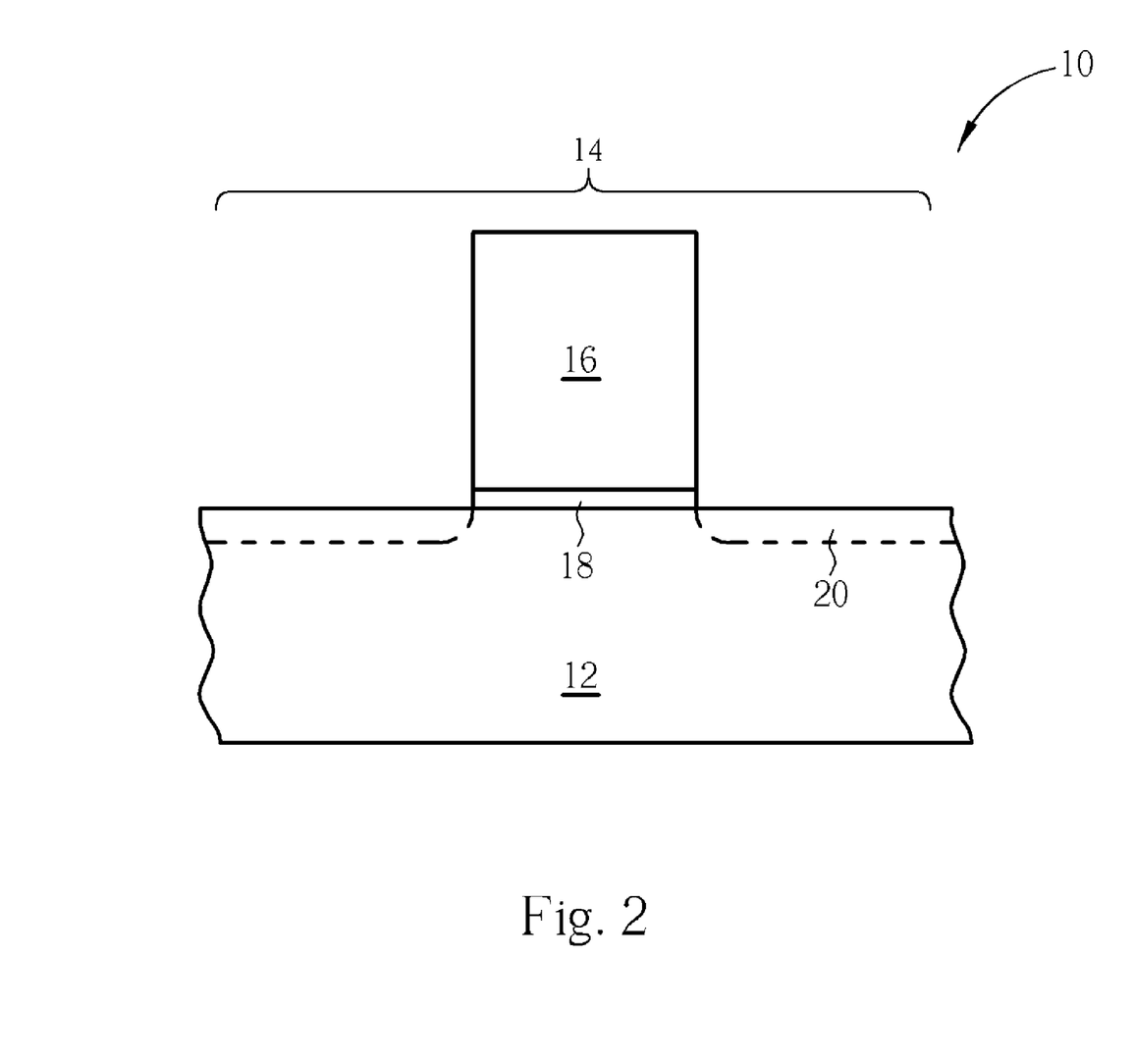

Then, the present invention rapid thermal process device 30 is utilized to perform a rapid annealing process to the substrate 10 for activating the dopants implanted in the source/drain extension doping regions 20. The present invention rapid thermal process device 30 comprises a heating system 32 containing at least a laser 36, and the laser 36 is capable of producing a first laser beam 38 (represented with the boldface line) and a second laser beam 40 (represented with lightface line) at the same time. The heating system 32 further comprises a laser control detector 42 that is capable of regulating the setting of the laser 36 anytime so as to control the first laser beam 38 and the second laser beam 40. In addition, the present invention rapid thermal process device 30 further comprises a temperature feedback control system 34 with automatic power control (APC) functionality. The temperature feedback control system 34 contains a detect device 46 and a signal processing device 44 that are capable of real-time detecting the heating performances of the first laser beam 38 and the second laser beam 40 to the substrate 10 and outputting signals to the heating system 32 for real-time adjusting the process parameters of the laser 36.

Figure 3:
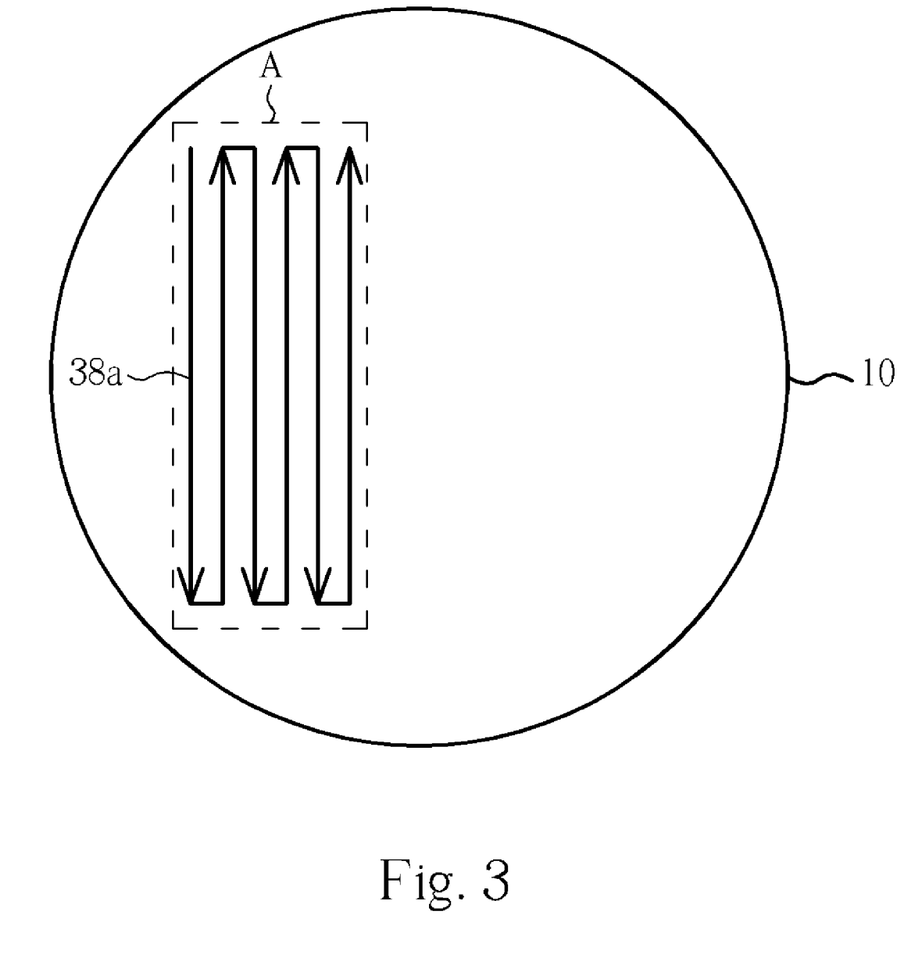
Figure 4:
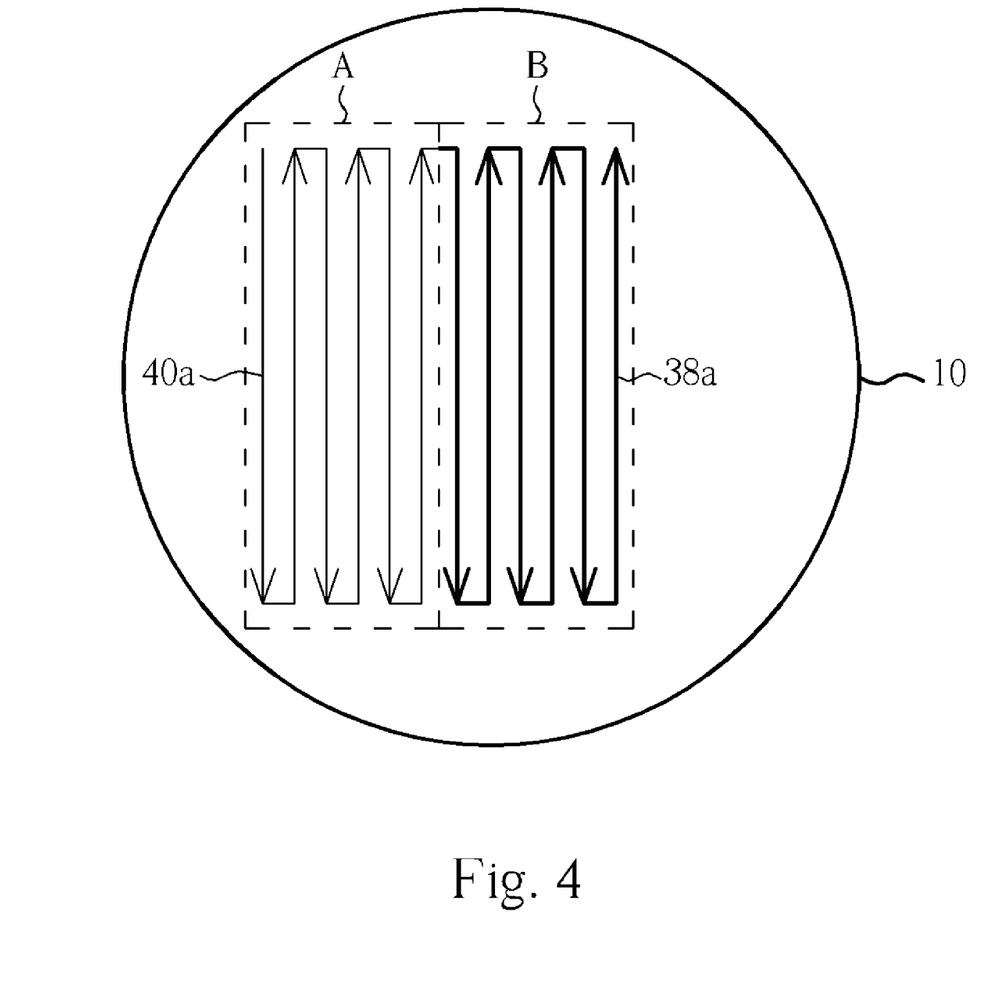
Figure 5:
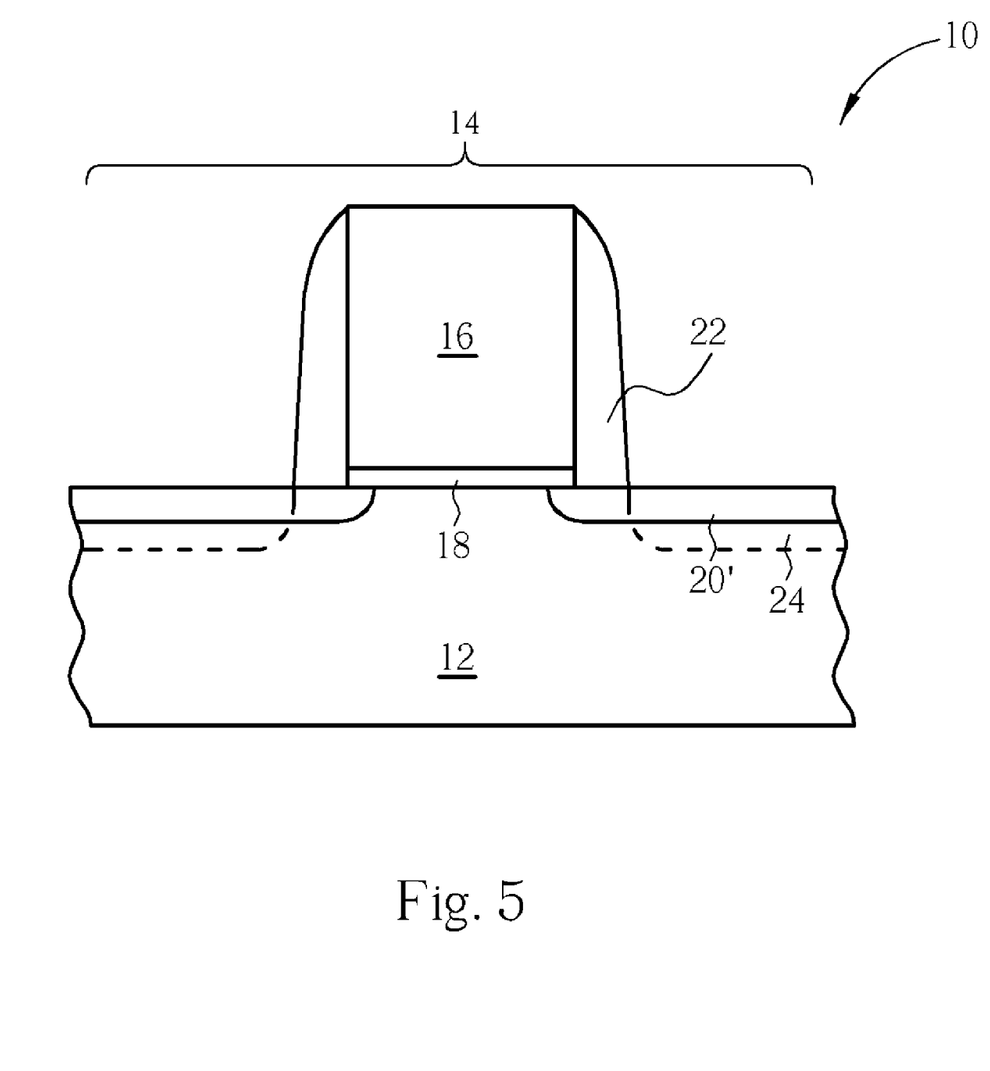

Referring to FIG. 3, during the rapid thermal process method of the present invention, a pre-heating process is performed to the first portion A of the substrate 10 by means of the first laser beam 38 (the boldface arrow is used to represent the scan path 38a of the first laser beam 38) in advance. Accordingly, the first portion A of the substrate 10 is locally pre-heated to a predetermined pre-heating temperature, such as about 400 to 500° C., while the other portions of the substrate 10 are still kept at a low temperature, such as at room temperature. Sequentially, as shown in FIG. 4, the second laser beam 40 is used to perform a rapid heating process (the lightface arrow is used for representing the scan path 40a of the second laser beam 40) to the pre-heated first portion A of the substrate 10 thereon. The rapid heating process may be a millisecond (msec) laser non-melt annealing process. As a result, during the rapid heating process, the first portion A of the substrate 10 is rapidly heated to about 1200 to 1300° C. or above 1300 ° C. so as to finish annealing and activating the substrate 10. Since the first portion A of the substrate 10 has been pre-heated to its critical temperature, enough free carriers have been generated for the annealing process of the second laser beam 40.

It should be noted that the first laser beam 38 may be used to continuously perform the locally pre-heating process to a second portion B of the substrate 10 while the second laser beam 40 is used to perform the rapid heating process to the pre-heated first portion A of the substrate 10. Afterward, after the second laser beam 40 scans the first portion A, it may keep on scanning the second portion B to perform the rapid heating process to the second portion B of the substrate 10, and meanwhile, the first laser beam 38 may further locally pre-heat a third portion (not shown) of the substrate 10. In other words, the locally pre-heating process of the first laser beam 38 and the rapid heating process the second laser beam 40 may be performed at the same time, provided that the specific portions of the substrate 10 is locally pre-heated by the first laser beam 38 before the rapid heating process of the second laser beam 40 so as to finish the rapid thermal process method of the present invention. In FIGS. 3-4 of this embodiment, the first portion A and the second portion B of the substrate 10 are illustrated for explanation. However, the process time difference of the first laser beam 38 and the second laser beam 40 successively exposing the same portion of the substrate 10 may be various according to different process requirements. If the process time difference is short, the total process time may be effectively reduced.

The rapid thermal process of the present invention is finished after both the scan of the first laser beam 38 and the scan of the second laser beam 40 to the substrate 10 are completed, and the fabrication of the source/drain extension doping regions 20' is accomplished. Then, please refer to FIG. 5. An oxide layer may be formed on the surface of the semiconductor wafer 12, and the oxide layer is etched so as to form the spacer 22 on the sidewall of the gate 16. Then, the spacer 22 is taken as an implantation mask, and an ion implantation process is performed to form the source/drain doped regions 24 on the surface of the semiconductor wafer 12. At this time, the rapid thermal process method of the present invention may be utilized again to perform a rapid thermal annealing process to the source/drain doped regions 24 for forming the shallow source/drain.

Regarding the rapid thermal process device 30 of the present invention, the content of which and the operative relation of its elements during the rapid thermal process will be detailed described as below. The rapid thermal process device 30 of the present invention mainly comprises a heating system 32 and a temperature feedback control system 34, and the heating system 32 further comprises a laser control detector 42 and a laser 36 that provides at least two laser beams. Wherein, the first laser beam 38 is used for pre-heating the substrate 10 in order to locally heating the substrate 10 to a pre-heat temperature, such as 400 to 500° C., while the second laser beam 40 is used for performing the rapid heating/cooling process to the substrate 10, such as a rapid thermal annealing process, which may locally heating the substrate 10 to a temperature of about 1200 to 1300° C. Since the first laser beam 38 is utilized for the pre-heating process before the rapid heating process, the pre-heating range of the substrate 10 has to be larger than the heating range of the second laser beam 40 to make sure that the scanning range of the second laser beam 40 has been pre-heated by the first laser beam 38. In other words, the size or exposing area of the first laser beam 38 has to be larger than or equal to the size or exposing area of the second laser beam 40. In a preferable embodiment, the size or exposing area of the first laser beam 38 is larger than that of the second laser beam 40. For example, if the size of the second laser beam 40 is about 1 mm×7 mm, and the size of the first laser beam 38 should be larger than 1 mm×7 mm. In addition, the laser control detector 42 provides a control feedback functionality of the laser 36 so that the laser control detector 42 may regulate the settings of the laser 36 to control the stability of the first laser beam 38 and the second laser beam 40.

On the other hand, the temperature feedback control system 34 has an automatic power control (APC) function, comprising a detecting device 46 and a signal processing device 44. The detecting device 46 is capable of detecting the heating performances to the substrate 10 of the first and the second laser beams 38, 40 at the same time. For example, the detecting device 46 may detect the temperature of the substrate 10 to see if it is heated to the predetermined temperature or not. Sequentially, signals may be transferred to the signal processing device 44 according to the detecting results. If regulation of the heating performances of the first and the second laser beam 38, 40 is required, the signal processing device 44 will execute a logic calculation of process bias according to the signals of the detecting device 46, which may be the transformation between the temperature bias and the voltage signal, so as to send an order to the heating system 32. As a result, the laser 36 will be regulated by the laser control detector 42 such that the performances of the first and the second laser beam 38, 40 meet requirements. In various embodiments of the present invention, the temperature feedback control system 34 may comprise two detecting devices 46 for detecting the heating performances of the first laser beam 38 and the second laser beam 40 to the substrate 10 respectively and sending the detecting results to the signal processing device 44 individually.

Figure 6:
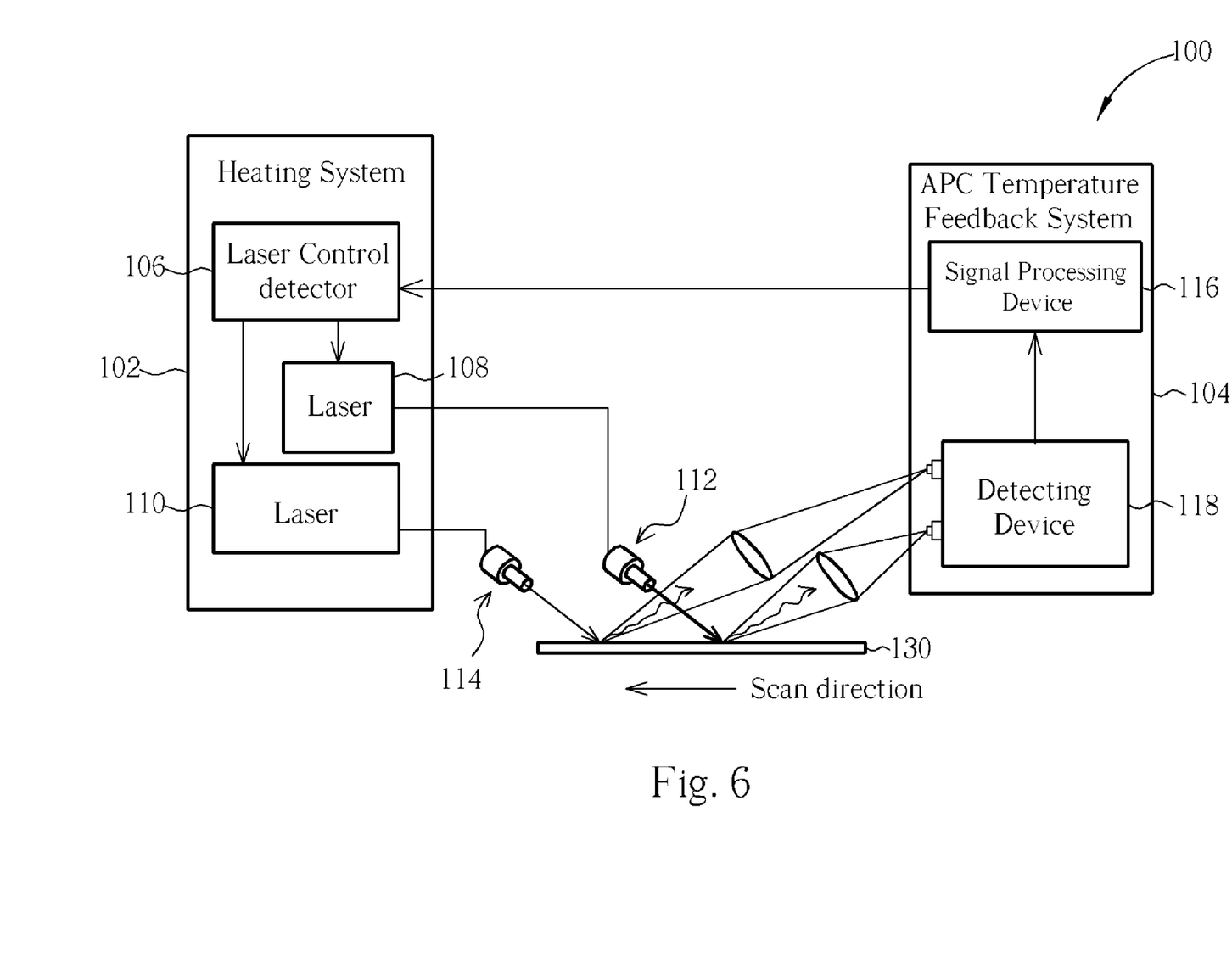
FIG. 6 is a schematic diagram of the rapid thermal process and the rapid thermal process device according to a second embodiment of the present invention.

Please refer to FIG. 6, which is a schematic diagram of the rapid thermal process method and rapid thermal process device according to a second embodiment of the present invention. The rapid thermal process device 100 of the present invention is used for performing a rapid thermal process of the substrate 130, and comprises a heating system 102 and a temperature feedback control system 104, wherein the temperature feedback control system 104 is an APC device. The heating system 102 comprises the first laser 108 and the second laser 110 that generate the first laser beam 112 and the second laser beam 114 respectively. The size or exposing range of the first laser beam 112 is larger than or equal to the size or exposing range of the second laser beam 114, and the exposing energy of the first laser beam 112 is lower than that of the second laser beam 114. The first and the second lasers 108, 110 may be controlled by a laser control detector 106 to have good stability, and the laser control detector 106 can also adjust the process parameters of the first laser beam 112 and the second laser beam 114. However, in various embodiments, the heating system 102 may comprises two laser control detectors 106 to control the first and second lasers 108, 110 individually.

The temperature feedback control system 104 comprises a signal processing device 116 and the detecting device 118, wherein the detecting device 118 is capable of real-time detecting the heating performances of the first laser beam 112 and the second laser beam 114 to the substrate 130 and sending the detecting results to the signal processing device 116. When the detecting results are different from the predetermined settings, the signal processing device 116 may logically calculate to produce parameter biases and sand them to the laser control detector 106. Accordingly, the process parameters of the first laser beam 112 and the second laser beam 114 may be real-time regulated for providing a preferable heating performance. In this embodiment, the substrate 130 may be a transparent substrate comprising an amorphous silicon layer thereon. Since the surface of the substrate 130 is pre-heated by the first laser beam 112, and is rapidly heated by the second laser beam 114, the amorphous silicon layer is melted and re-crystallized to from a polysilicon layer, which may serve as a semiconductor material in a thin film transistor. However, in other embodiments, the substrate 130 may be a semiconductor wafer.

Figure 7:
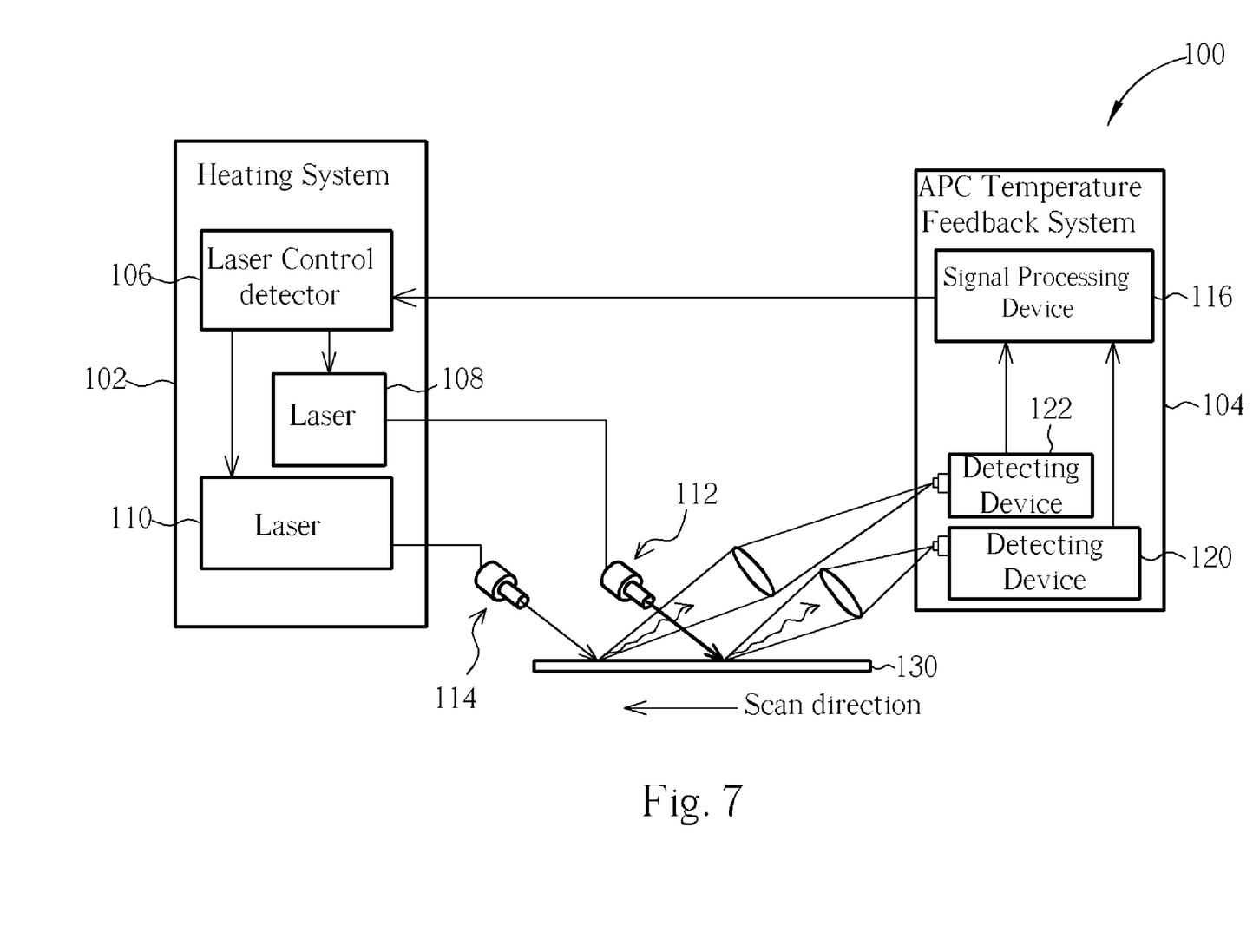
FIG. 7 is a schematic diagram of the rapid thermal process and the rapid thermal process device according to a third embodiment of the present invention.

With reference to FIG. 7, FIG. 7 is a schematic diagram of the rapid thermal process device of a third embodiment of the present invention. In order to simplify the explanation, the numerals of FIG. 7 are the same as those of FIG. 6 for the same elements. As shown in FIG. 7, the heating system 102 comprises the first and the second lasers 108, 110 that generate the first laser beam 112 and the second laser beam 114 respectively so as to perform a pre-heating process and a rapid heating process to the substrate 130. The rapid heating process may be an msec laser non-melt annealing process or a melt laser annealing process. The temperature feedback control system 104 comprises a first detecting device 120 and a second detecting device 122 used for detecting the heating performances of the first laser beam 112 and the second laser beam 114 to the substrate 130 respectively. The first detecting device 120 and the second detecting device 122 may further provide an analysis function of the detecting results individually and real-time transfer the analyses to the signal processing device 116 and the laser control detector 106 so as to real-time regulate the process parameters of the first laser beam 112 and the second laser beam 114.

The rapid thermal process method and device of the present invention may be applied to msec laser non-melt annealing processes, melt laser process or various rapid heating and cooling processes. In contrast to the prior art, the present invention utilizes a laser beam to pre-heat the substrate needing a rapid thermal treatment to replace the method of pre-heating the substrate by a conventional chuck. Since the present invention that uses a laser beam for pre-heating is capable of locally pre-heating the substrate, only a specific portion of the substrate is under heating whether during the pre-heating process of the first laser beam or the msec heating process of second laser beam, while other portions of the substrate are still kept at a low temperature or at room temperature. Therefore, the substrate breakage problem caused by thermal stress is avoided. Furthermore, in contrast to the long pre-heating or cooling down time through a chuck of the prior art, the first laser beam can rapidly pre-heating the substrate, thus the present invention can effectively lower the heat budget and avoid the temperature non-uniformity and sheet resistance non-uniformity. In addition, according to the conventionally method of using a chuck to heating the substrate, it is difficult to modify the chamber environment since the design of the chamber hardware, such as the chuck, have to be changed. In contrast, the rapid thermal process device of the present invention comprises an APC function so that the heating performance of the substrate may be real-time detected and the parameter settings of the laser beam can be regulated at anytime. Accordingly, the problem of sheet resistance and temperature uniformity can be real-time controlled such that the present invention provides a good process environment with high mobility. As mentioned above, the rapid thermal process and the rapid thermal process device of the present invention provide a good heating environment, reduce the tool cost, and increase the throughout.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rapid thermal process (RTP) method comprising:
   providing a substrate;
   performing a locally pre-heating process to at least a first portion of the substrate by means of a first laser beam, the first portion of the substrate being heated to a first temperature by the first laser beam; and
   performing a rapid heating process to the pre-heated first portion of the substrate for heating the first portion of the substrate to a second temperature which is higher than the first temperature.

2. The RTP method of claim 1, wherein the RTP method comprises utilizing a second laser beam to perform the rapid heating process to the pre-heated first portion of the substrate.

3. The RTP method of claim 2, wherein the RTP method further comprises utilizing the first laser beam to locally pre-heat at least a second portion of the substrate while performing the rapid heating process to the first portion of the substrate by means of the second laser beam, and then the second laser beam is used to perform the rapid heating process to the pre-heated second portion of the substrate.

4. The RTP method of claim 2, wherein a size of the first laser beam is approximately larger than a size of the second laser beam.

5. The RTP method of claim 2, wherein the rapid heating process comprises an msec (millisecond) laser non-melt annealing process.

6. The RTP method of claim 2, wherein the rapid heating process comprises a melt laser process.

7. The RTP method of claim 1, wherein the rapid heating process comprises an msec annealing process.

8. The RTP method of claim 1, wherein the other portions of the substrate are kept at a low temperature when performing the locally pre-heating process or the rapid heating process.

9. The RTP method of claim 1, wherein the other portions of the substrate are kept at a room temperature when performing the locally pre-heating process or the rapid heating process.

10. The RTP method of claim 1, wherein the rapid heating process rapidly heats the first portion of the substrate to a temperature of above 1200° C.

11. The RTP method of claim 10, wherein the rapid heating process rapidly heats the first portion of the substrate to a temperature of above 1300°C.

12. The RTP method of claim 1, wherein the locally pre-heating process locally heating the first portion of the substrate to a temperature of about 400 to 500°C.

13. The RTP method of claim 1, wherein the rapid thermal process further comprises providing an automatic power control (APC) device for real-time regulating process parameters of the locally pre-heating process and the rapid heating process individually.

14. The RTP method of claim 13, wherein the APC device comprises a detecting device for real-time detecting the heating performances of the locally pre-heating process and the rapid heating process.

15. The RTP method of claim 14, wherein the APC device further comprises a signal processing device for calculating of detecting results of the detecting device in order to further control and regulate the locally pre-heating process and the rapid heating process.

16. The RTP method of claim 1, wherein the substrate comprises a semiconductor substrate, and the rapid heating process forms an ultra shallow junction (USJ) on a surface of the semiconductor substrate.

17. The RTP method of claim 1, wherein the substrate comprises an amorphous silicon layer thereon, and the rapid heating process transfers the amorphous silicon layer into a low temperature polysilicon material.

* * * * *

UNITED STATES PATENT AND TRADEMARK OFFICE
CERTIFICATE OF CORRECTION

PATENT NO. : 7,776,728 B2  Page 1 of 1
APPLICATION NO. : 11/681745
DATED : August 17, 2010
INVENTOR(S) : Chan-Lon Yang et al.

It is certified that error appears in the above-identified patent and that said Letters Patent is hereby corrected as shown below:

On the title page, item (75) Inventors: correct the name of the first inventor from "Chan-Ion Yang" to -- Chan-Lon Yang --.

Signed and Sealed this

Sixteenth Day of November, 2010

David J. Kappos
*Director of the United States Patent and Trademark Office*